(12) United States Patent
Oshio et al.

(10) Patent No.: US 7,888,699 B2
(45) Date of Patent: Feb. 15, 2011

(54) LIGHT EMITTING DEVICE INCLUDING BLEED-OUT PREVENTING NOTCHES

(75) Inventors: Hiroaki Oshio, Kanagawa (JP);
Kazuhiro Tamura, Fukuoka (JP);
Masakata Koseki, Aichi-ken (JP);
Hiroko Tsukamoto, Aichi-ken (JP);
Tatsuichiro Maki, Aichi-ken (JP)

(73) Assignees: Kabushiki Kaisha Toshiba, Minato-ku, Tokyo (JP); Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 28 days.

(21) Appl. No.: 12/155,107

(22) Filed: May 29, 2008

(65) Prior Publication Data
US 2008/0296605 A1 Dec. 4, 2008

(30) Foreign Application Priority Data
May 30, 2007 (JP) .............................. 2007-144178

(51) Int. Cl.
*H01L 33/48* (2010.01)
(52) U.S. Cl. .......... 257/99; 257/E33.056; 257/E33.062; 257/E33.066
(58) Field of Classification Search ................... 257/99, 257/E33.056, E33.062, E33.066
See application file for complete search history.

(56) References Cited
U.S. PATENT DOCUMENTS
6,054,716 A  4/2000 Sonobe et al.
6,274,890 B1  8/2001 Oshio et al.
6,747,293 B2  6/2004 Nitta et al.
7,242,032 B2  7/2007 Oshio
2007/0246729 A1* 10/2007 Park ............................ 257/99

FOREIGN PATENT DOCUMENTS
JP     10-261821      9/1998
JP     2002124703 A * 4/2002
JP     3492178        11/2003

* cited by examiner

*Primary Examiner*—Leonardo Andújar
*Assistant Examiner*—Christopher M Roland
(74) *Attorney, Agent, or Firm*—McGinn IP Law Group, PLLC

(57) ABSTRACT

A light emitting device includes a resin case including a concave portion with a reflector portion surrounding a light emitting element, a first lead and a second lead that are formed of a metal, exposed at a bottom of the concave portion of the case, and disposed away from each other in a predetermined direction, and a resin sealing material filled in the concave portion. The first lead includes a light emitting element mounting portion, a first wire connection portion, a first bleed-out preventing notch, and an opposite notch. The second lead includes a protective device mounting portion, a second wire connection portion, and a second bleed-out preventing notch. The first lead and the second lead are arranged such that, in the predetermined direction, the light emitting element mounting portion is opposed to the second bleed-out preventing notch, the first wire connection portion is opposed to the protective device mounting portion, and the opposite notch is opposed to the second wire connection portion.

20 Claims, 4 Drawing Sheets

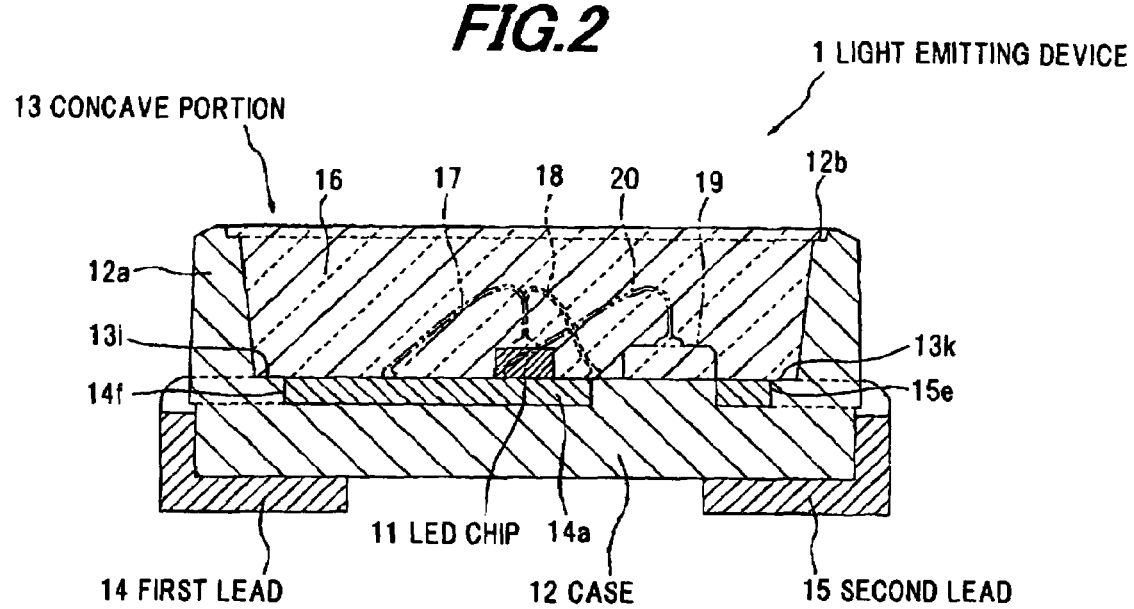

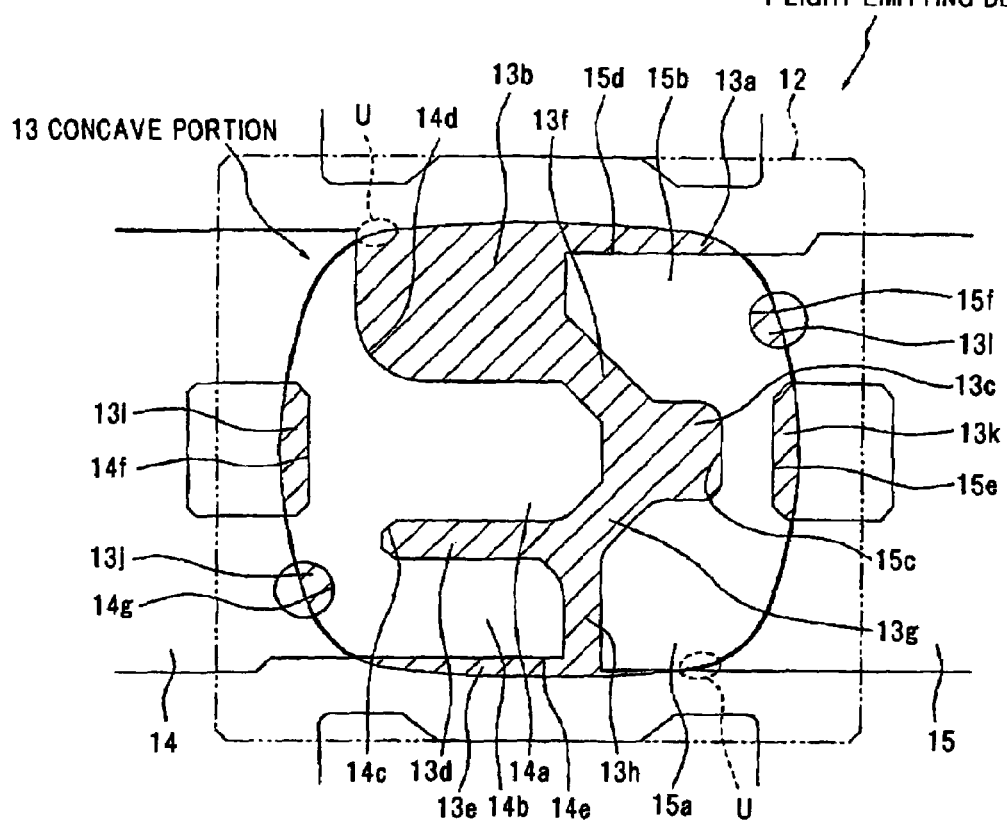

FIG.4

| | Example 1 | Comp. Ex. 1 | Comp. Ex. 2 | Comp. Ex. 3 | Comp. Ex. 4 | Comp. Ex.5 |
|---|---|---|---|---|---|---|
| (i) Area ratio occupied by metal part in bottom of concave portion | 65% | 66% | 66% | 49% | 82% | 74% |
| (ii) Length ratio of metal part overlapped (in top view) with inner edge of lower end of reflector portion with respect to entire circumference | 55% | 84% | 77% | 25% | 78% | 62% |
| (iii) Length ratio of metal part or resin part continuously overlapped (in top view) with inner edge of lower end of reflector portion | 30% | 58% | 58% | 75% | 20% | 20% |
| (iv) Ratio of section of metal part or resin part at inner edge of lower end of reflector portion asymmetrical to center of bottom with respect to entire circumference | 6% | 50% | 50% | 50% | 8% | 40% |
| Moisture absorption reflow test | ○ | × | × | × | × | × |

Comp. Ex.: Comparative Example

LIGHT EMITTING DEVICE INCLUDING BLEED-OUT PREVENTING NOTCHES

The present application is based on Japanese patent application No. 2007-144178 filed on May 30, 2007, the entire contents of which are incorporated herein by reference.

BACKGROUND OF THE INVENTION

1. Field of the Invention

This invention relates to a light emitting device that a light emitting element is mounted at the bottom of a concave portion of a case.

2. Description of the Related Art

A light emitting device using a light emitting element such as LED (light emitting diode) is known that is composed of the semiconductor light emitting element, a pair of leads electrically connected to electrodes of the semiconductor light emitting element, a resin stem equipped with a concave portion for housing the semiconductor light emitting element and the leads therein. For example, JP-B-3492178 discloses a light emitting device that the leads are disposed at the bottom of the concave portion of the resin stem and a transparent sealing material of silicone resin is filled inside the concave portion.

However, the light emitting device disclosed in JP-B-3492178 has a problem that the whole sealing material may move away from the bottom when conducting the moisture absorption reflow test since the resin sealing material has a relatively large linear expansion coefficient. This phenomenon becomes more significant when a part of the bottom of the concave portion is formed of the metal lead and the other part is formed of the resin material composing the case since local stress is generated in the sealing material due to the difference in adherence to the sealing material between the meal and the resin. If the resin material moves away from the bottom, the connection between the light emitting element and the leads may be broken such that the light emitting element fails to operate properly.

SUMMARY OF THE INVENTION

It is an object of the invention to provide a light emitting device that can prevent the separation of a sealing material from the bottom of a concave portion even when leads are disposed at the bottom of the concave portion of a case.

According to one embodiment of the invention, a light emitting device comprises:

a resin case including a concave portion comprising a reflector portion surrounding a light emitting element;

a first lead and a second lead that are formed of a metal, exposed at a bottom of the concave portion of the case, and disposed away from each other in a predetermined direction; and a resin sealing material filled in the concave portion, wherein the first lead comprises a light emitting element mounting portion which is located at a center of the bottom of the concave portion and on which the light emitting element is mounted through a bonding material, a first wire connection portion to which a first wire extending from one electrode of the light emitting element is connected, a first bleed-out preventing notch formed between the light emitting element mounting portion and the first wire connection portion, and an opposite notch formed opposite the first bleed-out preventing notch with respect to the light emitting element mounting portion, the second lead comprises a protective device mounting portion on which a protective device is mounted through a bonding material, a second wire connection portion to which a second wire extending from an other electrode of the light emitting element is connected and a second bleed-out preventing notch formed between the protective device mounting portion and the second bleed-out preventing notch, and the first lead and the second lead are arranged such that, in the predetermined direction, the light emitting element mounting portion is opposed to the second bleed-out preventing notch, the first wire connection portion is opposed to the protective device mounting portion, and the opposite notch is opposed to the second wire connection portion.

In the above embodiment, the following modifications and changes can be made.

(i) A part occupied by the first lead and the second lead in the bottom of the concave portion of the case is in a range of 50% to 75% in area ratio, a part of the first lead and the second lead overlapped in a top view with an inner edge of a lower end of the reflector portion is not more than 80% in length ratio with respect to an entire circumference of the inner edge of the lower end thereof, and a part of a resin part composing the case, first lead or the second lead continuously overlapped in the top view with the inner edge of the lower end of the reflector portion is not more than 50% in length ratio with respect to the entire circumference of the inner edge of the lower end thereof.

(ii) A part of a resin part composing the case, and a metal part composing the first lead and the second lead continuously overlapped in the top view with the inner edge of the lower end of the reflector portion not less than 50% in length ratio with respect to the entire circumference of the inner edge of the lower end thereof is disposed to be point-symmetrical to a center of the bottom of the concave portion.

(iii) The opposite notch of the first lead is formed at a position that it is overlapped in the top view with the inner edge of the lower end of the reflector portion.

(iv) The first lead further comprises a first inner edge notch that is formed opposite the first bleed-out preventing notch with respect to the first wire connection portion and at a position that it is overlapped in the top view with the inner edge of the lower end of the reflector portion, and the second lead further comprises a second inner edge notch that is formed opposite the second bleed-out preventing notch with respect to the second wire connection portion and at a position that it is overlapped in the top view with the inner edge of the lower end of the reflector portion.

(v) The first lead further comprises a hole formed at a position that it is overlapped in the top view with the inner edge of the lower end of the reflector portion, and the second lead further comprises a hole formed at a position that it is overlapped in the top view with the inner edge of the lower end of the reflector portion.

(vi) The hole of the first lead is formed to be point-symmetrical to the hole of the second lead with respect to the center of the bottom of the concave portion.

(vii) The hole of the first lead and the second lead comprises a plurality of holes.

(viii) The reflector portion comprises a step portion.

(ix) The sealing material comprises a silicone resin.

BRIEF DESCRIPTION OF THE DRAWINGS

The preferred embodiments according to the invention will be explained below referring to the drawings, wherein:

FIG. 2 is a cross sectional view cut along a line A-A in FIG. 1;

FIG. 3 is an illustrative top view showing an arrangement of a metal portion and a resin portion at the bottom of a concave portion of the light emitting device; and FIG. 4 is a table including various conditions (i) to (iv) of Example 1 according to the invention and of Comparative Examples 1 to 5 where the shape and arrangement of a lead are changed, and results of moisture absorption reflow test thereof.

DETAILED DESCRIPTION OF THE PREFERRED EMBODIMENTS

Figure 1:
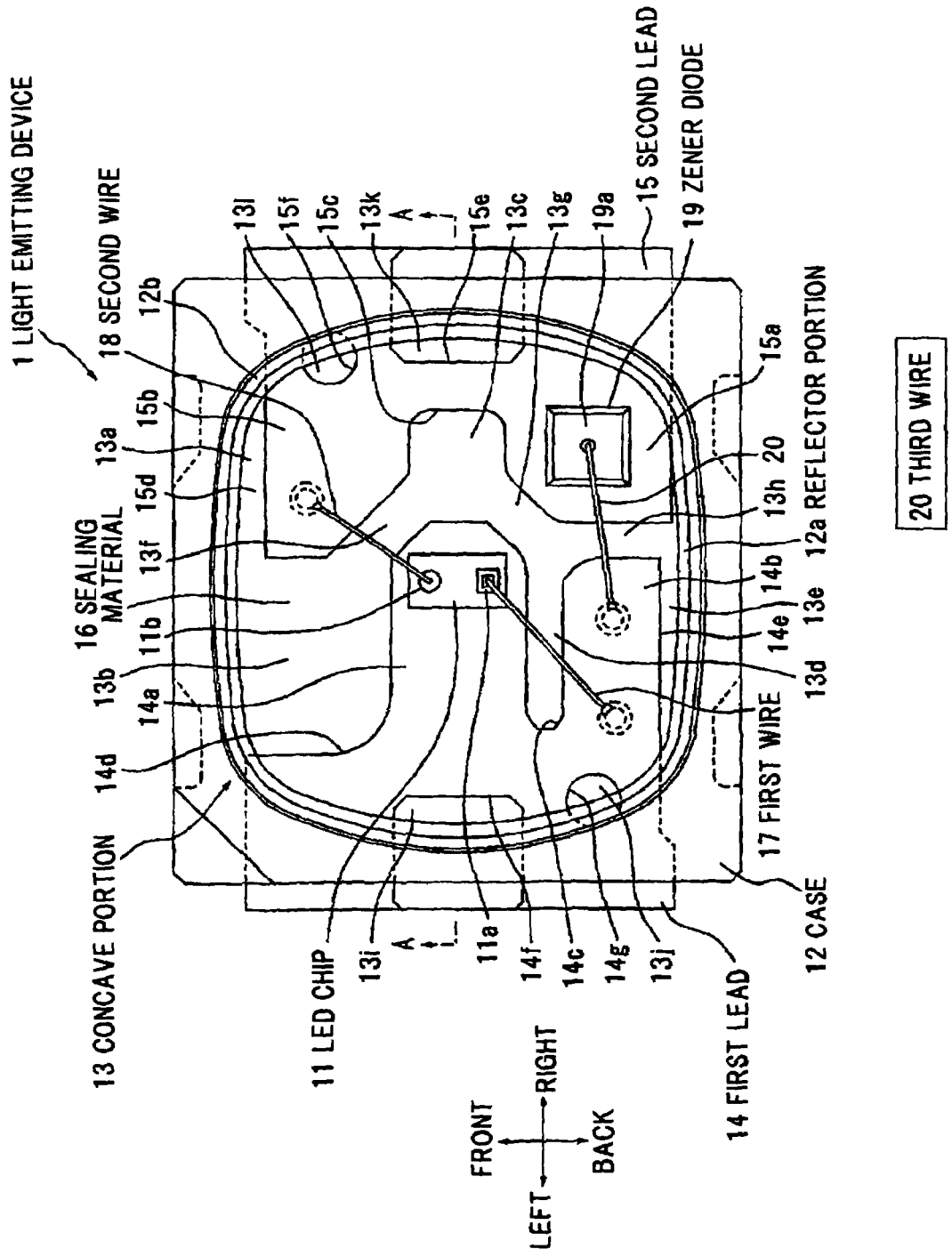
FIG. 1 is a top view showing a light emitting device in a preferred embodiment according to the invention.

FIGS. 1 to 3 show a light emitting device in one embodiment of the invention: FIG. 1 is a top view of the light emitting device. The following explanations will be made based on right, left, front and back directions indicated by coordinates in FIG. 1.

As shown in FIG. 1, the light emitting device 1 is composed of an LED chip 11 as a light emitting element, a resin case 12 having a concave portion 13 including a reflector portion 12a surrounding the LED chip 11, first and second leads 14, 15 made of a metal and disposed separated from each other in the right/left direction while being exposed on the bottom of the case 12, and a sealing material 16 made of a resin material and filled inside the concave portion 13. The light emitting device 1 is further composed of a first wire 17 for connecting one electrode 11a of the LED chip 11 to the first lead 14, a second wire 18 for connecting the other electrode 11b of the LED chip 11 to the second lead 15, a Zener diode 19 as a protective device, and a third wire 20 for connecting an electrode 19a formed on the Zener diode 19 to the first lead 14. The first to third wires 17, 18 and 20 are made of gold.

The case 20 is as a whole in the form of a nearly rectangular solid, the leads 14, 15 form a part of the bottom of the concave portion 13, and the resin case 12 forms the other part of the bottom of the concave portion 13. The leads 14, 15 are extended to an outside of the case 12 and electrically connected to an external connection terminal (not shown). For example, the case 12 is formed of a thermoplastic resin such as liquid-crystal polymer (LCP), polyphenylene sulfide (PPS), syndiotactic polystyrene (SPS), polyphthalamide (PPA) and nylon. The leads 14, 15 and the case 12 are molded by transfer molding, injection molding etc.

The opening of the concave portion 13 is formed nearly square in its top view and, in this embodiment, its right, left, front and back edges are formed externally expanded at middle portions thereof in its top view. Inside edges at the lower end of the reflector portion 12a are formed pointsymmetrical to the center of the bottom of the concave portion 13. The inner surfaces of the reflector portion 12a are formed expanded upward and provided with a step portion 12b on the top. Except the step portion 12b, the inner surfaces of the reflector portion 12a are formed smoothly curved. Inside the concave portion 13, the transparent sealing material 16 is filled for sealing the LED chip 11, the Zener diode 19 and the wires 17, 18 and 20. Light can be extracted through the sealing material 16 in the concave portion 13.

The LED chip 11 is a face-up type with a pair of electrodes 11a, 11b formed on its upper surface. In this embodiment, the LED chip 11 is formed of GaN-based semiconductor for emitting blue light. The LED chip 11 is secured to the first lead 14 through an epoxy die bonding paste (not shown).

The first and second leads 14, 15 are made of a conductive metal with silver plating. The first and second leads 14, 15 are formed with a predetermined thickness and width, and its longitudinal ends are each located inside the concave portion 13 of the case 12. In this embodiment, the right end of the first lead 14 and the left end of the second lead 15 are disposed a the bottom of the concave portion 13 while being separated from each other in the right/left direction.

The construction of the longitudinal ends of the first and second leads 14, 15 will be described below.

The first lead 14 is composed of a light emitting element mounting portion 14a which is located at the center of the concave portion 13 and on which the LED chip 11 is mounted, a first wire connection portion 14b to which the first wire 17 is connected, a first bleed-out preventing notch 14c formed between the light emitting element mounting portion 14a and the first wire connection portion 14b, an opposite notch 14d formed opposite the first bleed-out preventing notch 14c with respect to the light emitting element mounting portion 14a, and a first inner edge notch 14e formed opposite the first bleed-out preventing notch 14c with respect to the first wire connection portion 14b and at a position overlapped (in top view) with the inner edge of the lower end of the reflector portion 12a of the case 12.

The opposite notch 14d is located on the front side of the right end of the first lead 14, the first bleed-out preventing notch 14c is located nearer the back side in relation to the middle in front/back direction of the right end of the first lead 14, and the first inner edge notch 14e is located on the back side of the right end of the first lead 14. The opposite notch 14d is formed by notching the front corner of the right end of the first lead 14, the first bleed-out preventing notch 14c is formed by notching linearly from the right end of the first lead 14 to the left side, and the first inner edge notch 14e is formed by notching the back end by a predetermined length from the right end of the first lead 14 to the left side. Thus, at the right end of the first lead 14, the light emitting element mounting portion 14a is formed protruding rightward between the opposite notch 14d and the first bleed-out preventing notch 14c, and the first wire connection portion 14b is formed protruding rightward between the first bleed-out preventing notch 14c and the first inner edge notch 14e.

The second lead 15 is composed of a Zener mounting portion 15a on which the Zener diode 19 is mounted, a second wire connection portion 15b to which the second wire 18 is connected, a second bleed-out preventing notch 15c formed between the Zener mounting portion 15a and the second wire connection portion 15b, and a second inner edge notch 15d formed opposite the second bleed-out preventing notch 15c with respect to the second wire connection portion 15b and at a position overlapped (in top view) with the inner edge of the lower end of the reflector portion 12a of the case 12.

The second inner edge notch 15d is located on the front side of the left end of the second lead 15, the second bleed-out preventing notch 15c is located at the middle of the left end of the second lead 15. The second inner edge notch 15d is formed by notching the front end by a predetermined length from the left end to the right side of the second lead 15. The second bleed-out preventing notch 15c is formed by notching in the form of square from the left end to the right side of the second lead 15. Thus, at the left end of the second lead 15, the second wire connection portion 15b is formed protruding leftward between the second inner edge notch 15d and the second bleed-out preventing notch 15c, and the Zener mounting portion 15a is formed protruding leftward behind the second bleed-out preventing notch 15c.

As shown in FIG. 1, with the notches 14c, 14d, 14e, 15c and 15d of the leads 14, 15, the resin portion of the case 12 is exposed at the bottom of the concave portion 13. Further, the leads 14, 15 are provided with holes 14f, 14g, 15e and 15f for exposing the resin portion of the case 12 other than the notches 14c, 14d, 14e, 15c and 15d. The holes 14f, 14g, 15e and 15f are engaged with the sealing material 16 filled in the concave portion 13 such that the movement of the leads 14, 15 can be blocked to prevent the detachment of the leads 14, 15 from the case 12 even when load from the case 12 to outside is applied to the leads 14, 15.

The first lead 14 is provided with the first hole 14f and the second hole 14g at a position overlapped (in top view) with the inner edge of the lower end of the reflector portion 12a of the case 12. The first hole 14f is formed square and overlapped with the middle in front/back direction and the left side of the inner edge of the reflector portion 12a. The second hole 14g is formed circular and overlapped with the left-back side of the inner edge of the reflector portion 12a.

The second lead 15 is provided with the third hole 15e and the fourth hole 14f at a position overlapped (in top view) with the inner edge of the lower end of the reflector portion 12a of the case 12. The third hole 15e is formed square and overlapped with the middle in front/back direction and the right side of the inner edge of the reflector portion 12a. The fourth hole 15f is formed circular and overlapped with the right-front side of the inner edge of the reflector portion 12a. The first hole 14f and the second hole 14g of the first lead 14 are formed point-symmetrical to the center of the bottom of the concave portion 13 with respect to the third hole 15e and the fourth hole 15f of the second lead 15, respectively.

At the bottom of the concave portion 13, there are continuously formed a first exposed part 13a of resin exposed by the second inner edge notch 15d of the second lead 15, a second exposed part 13b of resin exposed by the opposite notch 14d of the first lead 14, a third exposed part 13c of resin exposed by the second bleed-out preventing notch 15c of the second lead 15, a fourth exposed part 13d of resin exposed by the first bleed-out preventing notch 14c of the first lead 14, and a fifth exposed part 13e of resin exposed by the first inner edge notch 14e of the first lead 14.

The second exposed part 13b and the third exposed part 13c are continuously formed through a first exposure extension 13f extending in right-back direction from the second exposed part 13b to the third exposed part 13c. The first exposure extension 13f is formed in a constant width in the extension direction by notching obliquely the right-front corner of the light emitting element mounting portion 14a of the first lead 14, and by notching obliquely the left-back corner of the second wire connection portion 15b of the second lead 15.

The third exposed part 13c and the fourth exposed part 13d are continuously formed through a second exposure extension 13g extending in left-back direction from the third exposed part 13b to the fourth exposed part 13d. The second exposure extension 13g is formed in a constant width in the extension direction by notching obliquely the right-back corner of the light emitting element mounting portion 14a of the first lead 14, and by notching obliquely the right-front corner of the Zener mounting portion 15a of the second lead 15.

The fourth exposed part 13d and the fifth exposed part 13e are continuously formed through a third exposure extension 13h extending in back direction from the fourth exposed part 13d to the fifth exposed part 13e. The third exposure extension 13h is formed in a constant width in the extension direction by making a clearance between the first wire connection portion 14b of the first lead 14 and the Zener mounting portion 15a of the second lead 15.

Furthermore, a sixth exposed part 13i is formed of resin exposed by the first hole 14f of the first lead 14, and a seventh exposed part 13j is formed of resin exposed by the second hole 14g of the first lead 14. Also, an eighth exposed part 13k is formed of resin exposed by the third hole 15e of the second lead 15, and a ninth exposed part 13l is formed of resin exposed by the fourth hole 15f of the second lead 15.

FIG. 2 is a cross sectional view cut along a line A-A in FIG. 1.

As shown in FIG. 2, the sealing material 16 is filled in the concave portion 13 to seal the LED chip 11, the Zener diode 19 and the wires 17, 18 and 20. In this embodiment, the sealing material 16 is formed of a silicone resin that is difficult to be yellowed due to heat, light etc. as compared to epoxy resins. The sealing material 16 is filled in the concave portion 13 after the LED chip 11 is mounted on the first lead 14 and the Zener diode 19 is mounted on the second lead 15. The method for filling the sealing material 16 may be freely selected if it only can seal the LED chip 11, the Zener diode 19 and the wires 17, 18 and 20. For example, it may be potting. After the sealing material 16 is filled in the concave portion 13, it is hardened under predetermined conditions. Although the sealing material 16 may be UV curable or heat curable resins, it is preferably the heat curable resins in consideration of the conditions of production facility for the device.

FIG. 3 is an illustrative top view showing an arrangement of a metal part and a resin part at the bottom of the concave portion of the light emitting device.

As shown in FIG. 3, the bottom of the concave portion 13 of the light emitting device 1 thus constructed is composed of a metal part where the leads 14, 15 are located and a resin part where the resin portion of the case 12 is exposed.

The metal part where the leads 14, 15 are located functions to reflect light emitted from the LED chip 11 and to dissipate heat generated from the LED chip 11.

The resin part of the case 12 functions to isolate the leads 14, 15 and to prevent the separation (or peeling) of the sealing material 16 from the bottom of the concave portion 13 since it has an adherence to the sealing material 16 greater than the metal part. Especially, since the resin part is located at a position overlapped (in top view) with the inner edge of the lower end of the reflector portion 12a of the case 12, the separation can be effectively prevented at the outer edge at the bottom of the concave portion 13 that is likely to be origination of a separation mode of the sealing material 16.

In the light emitting device 1, the light emitting element mounting portion 14a and the third exposed part 13c, the first wire connection portion 14b and the Zener mounting portion 15a, and the opposite notch 14d and the second wire connection portion 15b, respectively, are opposed to each other in the right/left direction. Thereby, at the center region of the bottom of the concave portion 13, the second exposed part 13b, the third exposed part 13c and fourth exposed part 13d are formed laterally zigzag (or alternately) along the front/back direction. Therefore, the sealing material 16 can have well-balanced adherence to the resin part of the case 12 at the center region of the bottom of the concave portion 13.

Adding to the above effect of the well-balanced adherence between the sealing material 16 and the resin part of the case 12, the light emitting device 1 of this embodiment can have the following effects.

(1) Since the LED chip 11 is mounted at the center of the concave portion 13, light can be extracted symmetrically in the right/left direction and in the front/back direction from the concave portion 13 so as to have an excellent light distribution characteristic.

(2) Since the second lead 15 and the first wire connection portion 14b are electrically connected through the Zener diode 19, the LED chip 11 can be protected from excessive current such as static electricity.

(3) The fourth exposed part 13d is located between the light emitting element mounting portion 14a and the first wire connection portion 14b of the first lead 14. The first exposure extension 13f is located between the light emitting element mounting portion 14a and the second wire connection portion 15b of the second lead 15. Therefore, the die bonding paste for the LED chip 11 can be prevented from bleeding out into the first wire connection portion 14b and the second wire connection portion 15b. Thus, the bonding failure between the first wire 17 and the second wire 18 and the first lead 14 and the second lead 15 due to the bleed-out of the die bonding paste can be prevented.

(4) The third exposed part 13c is located between the Zener mounting portion 15a and second wire connection portion 15b of the second lead 15. The third exposure extension 13h is located between the Zener mounting portion 15a and the first wire connection portion 14b of the first lead 14. Therefore, the die bonding paste for the Zener diode 19 can be prevented from bleeding out into the first wire connection portion 14b and the second wire connection portion 15b. Thus, the bonding failure between the first wire 17 and the third wire 20 and the first lead 14 and the second lead 15 due to the bleed-out of the die bonding paste can be prevented.

As described, the light emitting device 1 of this embodiment has the effects that the well-balanced adherence can be made between the sealing material 16 and the resin part of the case 12 so as to prevent the separation of the sealing material 16 from the concave portion 13, an excellent light distribution characteristic can be obtained, the LED chip 11 can be protected from excessive current, and the electrical boding failure due to the bleed-out of the die bonding paste for the LED chip 11 and the Zener diode 19 can be prevented. Thus, it is very advantageous for practical use.

Meanwhile, the electrical boding failure due to the bleed-out can be prevented if only there is at least one resin region on lines formed (in top view) between the mounting position of the LED chip 11 and the bonding position of the first wire 17 and the third wire 20 on the first lead 14 as well as the bonding position of the second wire 18 on the second lead 15. Also, it can be prevented if only there is at least one resin region on lines formed (in top view) between the mounting position of the Zener diode 19 and the bonding position of the first wire 17 and the third wire 20 on the first lead 14 as well as the bonding position of the second wire 18 on the second lead 15.

In the light emitting device of this embodiment, the opposite notch 14d of the first lead 14 is formed at a position overlapped (in top view) with the inner edge of the lower end of the reflector portion 12a of the case 12. Therefore, by the bonding part between the second exposed part 13b exposed by the opposite notch 14d and the sealing material 16, the separation can be prevented at the outer edge of the bottom of the concave portion 13.

Further, in the first lead 14 and the second lead 15, the holes 14f, 14g, 15e and 15f are formed at a position overlapped (in top view) with the inner edge of the lower end of the reflector portion 12a of the case 12. Therefore, by the bonding part between the sixth to ninth exposed parts 13i, 13j, 13k and 13l exposed by the holes 14f, 14g, 15e and 15f and the sealing material 16, the separation can be prevented at the outer edge of the bottom of the concave portion 13. In this embodiment, since the holes 14f, 14g of the first lead 14 and the holes 15e, 15f of the second lead 15 are formed multiply for each lead, the bonding sites between the optical block 16 and the case 12 are dispersed such that stress generated at the bonding sites can be dispersed.

In this embodiment, the holes 14f, 14g of the first lead 14 are formed point-symmetrical to the center of the bottom of the concave portion 13 with respect to the holes 15e, 15f, respectively, of the second lead 15. Therefore, the outer part of the optical block 16 can be evenly bonded to the case 12 on the right and left sides. Thus, when a force is applied to separate the sealing material 16 from the bottom of the concave portion 13, its load can be evenly charged on the right and left sides.

Further, the first lead 14 is provided with the first inner edge notch 14e, the second lead 15 is provided with the second inner edge notch 15d, and the first exposed part 13a and the fifth exposed part 13e are formed at a position overlapped (in top view) with the inner edge of the lower end of the reflector portion 12a of the case 12. Therefore, the separation can be prevented at the outer edge of the bottom of the concave portion 13. Meanwhile, in this embodiment, the first inner edge notch 14e is formed point-symmetrical to the center of the bottom of the concave portion 13 with respect to the second inner edge notch 15d.

Further, the reflector portion 12a is provided with the step portion 12b. Thereby, when a force is applied to separate the sealing material 16 from the bottom of the concave portion 13, the movement of the sealing material 16 along the inner surface of the reflector portion 12a can be prevented by the step portion 12b.

The state of the bottom of the light emitting device 1 of this embodiment will be explained below by using measured data as shown in FIG. 4.

As shown in FIG. 4, Example 1 corresponds to the light emitting device of this embodiment and Comparative Examples 1 to 5 correspond to light emitting devices that have the same concave portion as this embodiment and different shape and arrangement in each lead from this embodiment.

In FIG. 4, item (i) relates to an area ratio (%) occupied by the metal part in the bottom of the concave portion, item (ii) relates to a length rate (%) of the metal part overlapped (in top view) with the inner edge of the lower end of the reflector portion with respect to the entire circumference, item (iii) relates to a length ratio (%) of the metal part or resin part continuously overlapped (in top view) with the inner edge of the lower end of the reflector portion, and item (iv) relates to a rate (%) of a section of the metal part or resin part at inner edge of the lower end of the reflector portion asymmetrical to the center of the bottom with respect to the entire circumference. A moisture absorption reflow test is conducted while changing the items (i) to (iv).

The moisture absorption reflow test is conducted by imposing thereon moisture absorption at 85° C./85% RH for 24 hours and, thereafter, peak temperature of 260° C. two times.

20 samples are prepared each for Example 1 and Comparative Examples 1 to 5. Each 20 samples are subjected to the moisture absorption reflow test, where it is evaluated (×) to have at least one sample where the separation of the sealing material from the bottom is observed, and it is evaluated (○) to have no sample where the separation of the sealing material from the bottom is observed.

As shown in FIG. 4, item (i) of Example 1 is 65% in area ratio occupied by the metal part (i.e., the leads 14, 15) in the bottom of the concave portion 13 of the case 12. Item (ii) thereof is 55% in length ratio of the metal part overlapped (in top view) with the inner edge of the lower end of the reflector portion 12a of the case 12 with respect to the entire circumference. Item (iii) thereof is 30% in length ratio of the resin part continuously overlapped (in top view) with the inner edge of the lower end of the reflector portion. In addition, a section of the metal and resin part 10% or more continuously located with respect to the entire circumference of the inner edge of the lower end of the reflector portion 12a is confirmed point-symmetrical to the center of the bottom of the concave portion 13. Item (iv) thereof is 6% in rate of a section of the metal part or resin part at inner edge of the lower end of the reflector portion asymmetrical to the center of the bottom of the concave portion 13 with respect to the entire circumference. As shown in FIG. 3, 'U' indicates a section symmetrical to the center of the bottom of the concave portion 13 in the inner edge of the lower end of the reflector portion 12a. Example 1 thus constructed is evaluated (○) by the moisture absorption reflow test.

As seen from Example 1 and Comparative Examples 1 to 5, the separation of the sealing material 16 from the bottom of the concave portion 13 can be effectively prevented by: setting 50 to 75% for area ratio occupied by the metal part in the bottom of the concave portion 13 of the case 12; setting 80% or less for length ratio of the metal part with respect to the entire circumference of the inner edge of the lower end of the reflector portion 12a; and setting 50% or less for continuous length ratio of one of the metal and resin parts with respect to the entire circumference of the inner edge of the lower end of the reflector portion 12a.

In addition to this, by setting a section of the metal and resin part 10% or more continuously located with respect to the entire circumference of the inner edge of the lower end of the reflector portion 12a to be point-symmetrical to the center of the bottom of the concave portion 13, and by setting a section thereof not point-symmetrical to the center of the bottom of the concave portion 13 to be 20% or less with respect to the entire circumference thereof, the sealing material 16 can be bonded being well-balanced to the circumference edge of the bottom of the concave portion 13. In this case, no separation of the sealing material 16 is confirmed by the moisture absorption reflow test.

In contrast, Comparative Examples 1 to 5 all of which do not satisfy at least one of the conditions (i) to (iv) are evaluated (×) by the moisture absorption reflow test. Meanwhile, Comparative Examples 1 to 5 are constructed as in Example 1 such that a section of the metal and resin part 10% or more continuously located with respect to the entire circumference of the inner edge of the lower end of the reflector portion 12a is point-symmetrical to the center of the bottom of the concave portion 13.

The reasons why, in this embodiment, the separation of the sealing material 16 from the bottom of the concave portion 13 can be effectively prevented are estimated as follows.

During the moisture absorption reflow test, by a force applied to the sealing material 16 in direction away from the bottom of the concave portion 13, local stress may be generated in the sealing material 16 since a part of the bottom is formed of the metal leads 14, 15 and the other part is formed of resin case 12 whereby the adherence to the sealing material 16 is relatively low at the metal part and relatively high at the resin part.

Here, by setting the area ratio occupied by the metal part at the bottom of the concave portion 13 in the range of 50 to 75%, the area ratio can be optimized between the metal part and the resin part so as to reduce the local stress.

Further, by setting the length ratio of the metal part with respect to the entire circumference of the inner edge of the lower end of the reflector portion 12a to be 80% or less, the sealing material 16 can be bonded to the resin part at a section of 20% or more of the inner edge of the lower end thereof to prevent the separation of the sealing material 16 at the inner edge of the lower end thereof. Thereby, the lift-up of the sealing material 16 can be effectively prevented.

Further, by setting 50% or less for continuous length ratio of one of the metal and resin parts with respect to the entire circumference of the inner edge of the lower end of the reflector portion 12a, the metal part and the resin part can be disposed being well-balanced at the inner edge of the lower end thereof so as to reduce the local stress.

Further, by setting a section of the metal and resin part 10% or more continuously located with respect to the entire circumference of the inner edge of the lower end of the reflector portion 12a to be point-symmetrical to the center of the bottom of the concave portion 13, and by setting a section thereof not point-symmetrical to the center of the bottom of the concave portion 13 to be 20% or less with respect to the entire circumference thereof, occurrence of force biased to the center the sealing material 16 can be suppressed so as to reduce the local stress.

Accordingly, the sealing material 16 as a whole can be prevented from moving away from the bottom of the concave portion 13 such that the LED chip 11, the Zener diode 19 and the electrical connection parts such as the wires 17, 18 and 20 can be properly protected.

In the above embodiment, light emitted from the LED chip 11 can be externally discharged without being wavelength-converted. However, the sealing material 16 may include a phosphor such that a part of light emitted from the LED chip 11 can be externally discharged while being wavelength-converted. In case of the blue light emitting LED chip 11, the phosphor may be a yellow phosphor such as YAG (yttrium aluminum garnet) and silicate-based phosphors such that white light can be externally discharged by the combination of blue light and yellow light. The phosphor may be dispersed in the sealing material 16 by using a dispersion agent etc. or may be sunk in the sealing material 16.

Although in the embodiment the LED chip 11 is used for emitting blue light, it may be used for green light or red light. Alternatively, three blue, green and red LED chips 11 may be mounted on separate leads for constructing a light emitting device to radiate white light.

If only the shape of the concave portion 13 and the leads 14, 15 is the same as the above embodiment, a flip-chip type LED chip 11 can be alternatively used to suppress the separation of the sealing material 16.

Further, an LED chip may be used for emitting violet or UV light as well as the sealing material including phosphors for radiating red, green and blue lights so as to have white light.

Although in the embodiment the LED chip 11 of GaN-based semiconductor is used for the light emitting device 1, an LED chip of another semiconductor such as ZnSe and SiC-based semiconductors may be used therefor.

Although the embodiment of the invention is applied to the top-view type light emitting device, it may be also applied to a side-view type, COB (chip on board) type light emitting device etc.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:
1. A light emitting device, comprising:
 a resin case including a concave portion comprising a reflector portion surrounding a light emitting element;

a first lead and a second lead that are formed of a metal, exposed at a bottom of the concave portion of the resin case, and disposed away from each other in a predetermined direction; and a resin sealing material filled in the concave portion, wherein the first lead comprises a light emitting element mounting portion which is located at a center of the bottom of the concave portion and on which the light emitting element is mounted through a bonding material, a first wire connection portion to which a first wire extending from one electrode of the light emitting element is connected, a first bleed-out preventing notch formed between the light emitting element mounting portion and the first wire connection portion, and an opposite notch formed opposite the first bleed-out preventing notch with respect to the light emitting element mounting portion, wherein the second lead comprises a protective device mounting portion on which a protective device is mounted through a bonding material, a second wire connection portion to which a second wire extending from another electrode of the light emitting element is connected, and a second bleed-out preventing notch formed between the protective device mounting portion and the second wire connection portion, and wherein the first lead and the second lead are arranged such that, in the predetermined direction, the light emitting element mounting portion directly faces and partially protrudes into the second bleed-out preventing notch that is shaped to receive the light emitting element mounting portion, the first wire connection portion is opposed to the protective device mounting portion, and the opposite notch is opposed to the second wire connection portion.

2. The light emitting device according to claim 1, wherein:
a part occupied by the first lead and the second lead in the bottom of the concave portion of the resin case is in a range of 50% to 75% in an area ratio;
a part of the first lead and the second lead overlapped in a top view with an inner edge of a lower end of the reflector portion is not more than 80% in a length ratio with respect to an entire circumference of the inner edge of the lower end thereof; and
a part of a resin part comprising the resin case, the first lead and the second lead continuously overlapped in the top view with the inner edge of the lower end of the reflector portion is not more than 50% in a length ratio with respect to the entire circumference of the inner edge of the lower end thereof.

3. The light emitting device according to claim 2, wherein the part of a resin part comprising the resin case, and a metal part comprising the first lead and the second lead continuously overlapped in the top view with the inner edge of the lower end of the reflector portion not less than 50% in length ratio with respect to the entire circumference of the inner edge of the lower end thereof is disposed to be point-symmetrical to a center of the bottom of the concave portion.

4. The light emitting device according to claim 3, wherein the opposite notch opposite of the first lead is formed at a position that it is overlapped in the top view with the inner edge of the lower end of the reflector portion.

5. The light emitting device according to claim 4, wherein:
the first lead further comprises a first inner edge notch that is formed opposite the first bleed-out preventing notch with respect to the first wire connection portion and at a position that it is overlapped in the top view with the inner edge of the lower end of the reflector portion; and the second lead further comprises a second inner edge notch that is formed opposite the second bleed-out preventing notch with respect to the second wire connection portion and at a position that it is overlapped in the top view with the inner edge of the lower end of the reflector portion.

6. The light emitting device according to claim 5, wherein:
the first lead further comprises a hole formed at a position that it is overlapped in the top view with the inner edge of the lower end of the reflector portion; and
the second lead further comprises a hole formed at a position that it is overlapped in the top view with the inner edge of the lower end of the reflector portion.

7. The light emitting device according to claim 6, wherein the hole of the first lead is formed to be point-symmetrical to the hole of the second lead with respect to the center of the bottom of the concave portion.

8. The light emitting device according to claim 7, wherein the hole of the first lead and the hole of the second lead comprises a plurality of square-shaped and circular-shaped holes that are overlapped in the top view with the inner edge of the lower end of the reflector portion.

9. The light emitting device according to claim 8, wherein the reflector portion comprises a step portion.

10. The light emitting device according to claim 1, wherein the sealing material comprises a silicone resin.

11. The light emitting device according to claim 1, wherein the light emitting element mounting portion is located between the first bleed-out preventing notch and the opposite notch.

12. The light emitting device according to claim 1, wherein the light emitting element mounting portion protrudes outward between the first bleed-out preventing notch and the opposite notch.

13. The light emitting device according to claim 1, further comprising:
a first exposed part between an inner edge of a lower end of the reflector portion and the second wire connection portion;
a second exposed part between the inner edge of the lower end of the reflector portion and at least one of the opposite notch;
a third exposed part between the protective device mounting portion and the second wire connection portion;
a fourth exposed part between the light emitting element mounting portion and the first connection portion; and
a fifth exposed part between the first wire connection portion and the inner edge of the lower end of the reflector portion.

14. The light emitting device according to claim 13, further comprising:
a first exposure extension located between the light emitting element mounting portion and the second wire connection portion;
a second exposure extension extending from the third exposed part to the fourth exposed part; and
a third exposure extension located between the protective device portion and the first wire portion.

15. The light emitting device according to claim 1,
wherein the first lead comprises a first inner edge notch,
wherein the second lead comprises a second inner edge notch, and
wherein the first inner edge notch is point-symmetrical to a center of the bottom of the concave portion with respect to the second inner edge notch.

16. The light emitting device according to claim 1, wherein the reflector portion further comprises a step portion opposite the bottom of the concave portion of the resin case.

17. A light emitting device, comprising:
a concave portion comprising a reflector portion enclosing a light emitting element;
a first lead and a second lead at a bottom of the concave portion; and
a resin sealing material filling the concave portion;
wherein the first lead comprises:
   a light emitting element mounting portion having the light emitting element at a center of the bottom of the concave portion between a first bleed-out preventing notch and an opposite notch; and
   a first wire connection portion between the first bleed-out preventing notch and a first inner edge notch, the first wire connection portion having a first wire extending from a electrode connected to the light emitting element,
wherein the second lead comprises:
   a second bleed-out preventing notch located between a protective device mounting portion having a protective device, and a second wire connection portion having a second wire connected to another electrode located on the light emitting element, and
wherein the first lead and the second lead are arranged so that the light emitting element mounting portion is located directly opposite to and partially protrudes into the second bleed-out preventing notch that is shaped to receive the light emitting element mounting portion, and the first wire connection portion is located directly opposite to the protective device mounting portion, and the opposite notch is located directly opposite to the second wire connection portion.

18. The light emitting device according to claim 17, wherein the second lead comprises a second inner edge notch, and
wherein the first inner edge notch is point-symmetrical to a center of a bottom of the concave portion with respect to the second inner edge notch.

19. The light emitting device according to claim 17, wherein the reflector portion further comprises a step portion.

20. The light emitting device according to claim 17, further comprising:
a first exposed part;
a second exposed part connected to the first exposed part;
a third exposed part connected to the second exposed part via a first exposure extension;
a fourth exposed part connected to the third exposed part via a second exposure extension; and
a fifth exposed part connected to the fourth exposed part via a third exposure extension.

* * * * *